(12) United States Patent
Iwano

(10) Patent No.: US 10,003,327 B2
(45) Date of Patent: Jun. 19, 2018

(54) FIELD DEVICE WITH ENHANCED NOISE RESISTANCE

(71) Applicant: YOKOGAWA ELECTRIC CORPORATION, Musashino-shi, Tokyo (JP)

(72) Inventor: Youichi Iwano, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days. days.

(21) Appl. No.: 14/844,451

(22) Filed: Sep. 3, 2015

(65) Prior Publication Data

US 2016/0072489 A1    Mar. 10, 2016

(30) Foreign Application Priority Data

Sep. 8, 2014    (JP) .................. 2014-182514

(51) Int. Cl.
| | | |
|---|---|---|
| *H03K 5/1252* | (2006.01) | |
| *G01D 21/00* | (2006.01) | |
| *G01D 3/08* | (2006.01) | |

(52) U.S. Cl.
CPC ........... *H03K 5/1252* (2013.01); *G01D 21/00* (2013.01); *G01D 3/08* (2013.01)

(58) Field of Classification Search
CPC .................................................. H03K 5/1252
See application file for complete search history.

(56) References Cited

U.S. PATENT DOCUMENTS

| | | | |
|---|---|---|---|
| 4,698,586 A | 10/1987 | Roos et al. | |
| 5,535,243 A | 7/1996 | Voegele et al. | |
| 6,292,501 B1 * | 9/2001 | DuBose | H01S 5/042 323/355 |
| 7,190,102 B2 * | 3/2007 | VanderSluis | H01L 41/042 310/316.03 |
| 7,616,694 B2 * | 11/2009 | Mori | H03K 4/94 375/219 |
| 2006/0033614 A1 | 2/2006 | Kleen et al. | |

FOREIGN PATENT DOCUMENTS

| | | |
|---|---|---|
| CN | 201408014 Y | 2/2010 |
| DE | 2244677 B1 | 3/1974 |
| DE | 2701184 A1 | 7/1978 |
| JP | 46-40230 | 11/1971 |
| JP | 53-107387 A | 9/1978 |
| JP | 10-503039 A | 3/1998 |
| JP | 2007-156997 A | 6/2007 |
| WO | 95/34027 A1 | 12/1995 |

OTHER PUBLICATIONS

Communication issued Aug. 2, 2016, issued by the Japanese Patent Office.
Communication dated Mar. 1, 2016 issued by European Patent Officer in counterpart European Patent Application No. 15183911.5.

\* cited by examiner

*Primary Examiner* — Hai L Nguyen

(74) *Attorney, Agent, or Firm* — Sughrue Mion, PLLC

(57) ABSTRACT

A field device includes a current output circuit, a sensor circuit, and a terminal portion. The current output circuit and the sensor circuit are connected a two-wire loop wiring via the terminal portion in a state that the current output circuit and the sensor circuit are connected in series with each other. A rectifying element is connected to only a sensor circuit side of the terminal portion.

6 Claims, 6 Drawing Sheets

FIELD DEVICE WITH ENHANCED NOISE RESISTANCE

CROSS-REFERENCE TO RELATED APPLICATION

The present application claims priority from Japanese Patent Application No. 2014-182514 filed on Sep. 8, 2014, the entire content of which is incorporated herein by reference.

BACKGROUND

The present disclosure relates to a two-wire field device, and particularly to a technique for enhancing noise resistance of a two-wire field device having a sensor portion.

A two-wire field device having a sensor portion for measuring a physical amount is configured to be operated by a constant voltage supplied from a direct current power supply device through a loop wiring and also to convert a measuring result of the sensor portion to a direct current value to output the value to the loop wiring. Recently, a technique in which a direct current signal overlapped with digital data is transmitted and received is widely performed.

In Patent Document 1, as shown in FIGS. 6A and 6B, in a field device having an effective capacitance Ceff, in order to prevent charges accumulated in the capacitance from being discharged into a loop wiring, a diode D as a rectifying element is connected in series to an input side (FIG. 6A) or to a plus side and a minus side (FIG. 6B). Also, in order to escape a high frequency noise, which flows through the loop wiring, to the ground, capacitors Ch and Cl are respectively connected to the plus side and the minus side. Meanwhile, the diode D is configured in three stages for a redundancy structure, but may be configured in one stage.

[Patent Document 1] International Patent Publication No. WO95/34027

FIGS. 7A and 7B are views schematically showing an impedance circuit including the effective capacitance Ceff by means of circuit blocks of an actual field device. Namely, the field device has a current output circuit 310, a power supply circuit/control circuit 320 and a sensor circuit 330. Meanwhile, elements of a direct power supply system connected to the loop wiring are omitted.

FIG. 7A is a case where a diode 340 as a rectifying element is connected to a plus side of a terminal portion, corresponding to FIG. 6A. FIG. 7B is a case where a diode 340 is connected to a plus side of a terminal portion and a diode 350 is connected to a minus side of the terminal portion, corresponding to FIG. 6B.

The current output circuit 310 controls a current to be flowed into the loop wiring. The power supply circuit/control circuit 320 includes a power supply circuit for supplying electric power, which has been supplied thereto through the loop wiring, to each circuit and a control circuit for calculating a signal from the sensor circuit 330 and determining a current to be flowed into the loop wiring. Impedance Za of the current output circuit 310 is designated as Za and impedance of the power supply circuit/control circuit 320 is designated as Zb.

The sensor circuit 330 measures a physical amount and transmits the physical amount to the power supply circuit/control circuit 320. Herein, the sensor circuit 330 is a grounding type in which a reference point thereof is grounded. Accordingly, impedance Zsh (plus side) and impedance Zsl (minus side) exist with respect to the ground due to stray capacitance and the like.

In the field device, a parallel circuit, which is constituted of the power supply circuit/control circuit 320 and the sensor circuit 330, and the current output circuit 310 are generally connected to the loop wiring in a state that the parallel circuit and the current output circuit 310 are connected in series with each other, and the current output circuit 310 is arranged on the plus side.

Herein, it is assumed that a common-mode noise Vn, which is a noise having an identical phase on the plus side and the minus side and measured with respect to the ground, is mixed in the loop wiring of the field device. The common-mode noise Vn is occurred due to electromagnetic interference, such as unnecessary radiation.

The common-mod noise Vn influences the plus side of the sensor circuit 330 by means of a path A extending from the loop wiring through the current output circuit 310 to the plus side of the sensor circuit 330 and also influences the minus side of the sensor circuit 330 by means of a path B extending from the loop wiring to the minus side of the sensor circuit 330.

In the path A of the circuit of FIG. 7A, the common-mode noise Vn is rectified by the diode 340 and the capacitor Ch, and also a noise divided by the impedance Za of the current output circuit 310 and the plus-side impedance Zsh of the sensor circuit 330 is applied to the plus side of the sensor circuit 330. Because the impedance Za of the current output circuit 310 is generally large, an influence of the noise on the sensor circuit 330 is relatively small.

On the other hand, in the path B of the circuit of FIG. 7A, a component of the common-mode noise, which cannot be removed by the capacitor Cl, is directly applied to the sensor circuit 330. Accordingly, noise resistance of the sensor circuit 30 is deteriorated.

Contrarily, in the circuit of FIG. 7B, a path A is the same as that of FIG. 7A, but a path B is configured so that a noise rectified by the diode 350 and the capacitor Cl is applied to the sensor circuit 330. Accordingly, the noise component is not directly applied to the sensor circuit 330, thereby preventing deterioration of noise resistance.

In a case of focusing on a magnitude of noise applied to the sensor circuit 330, as shown in FIG. 7B, diodes are preferably connected to both of the plus-side path A and the minus-side path B.

However, if diodes are connected to both of the plus-side path A and the minus-side path B, forward drop voltages of the diodes are applied to both of the plus side and the minus side, thereby increasing the lowest operation voltage of the field device. Also, because rectifying is performed on both of the plus side and the minus side, a direct voltage is occurred between an nA point and an nB point in the figure, thereby causing a negative effect that it is necessary to increase a withstand voltage of a circuit inside of the field device.

SUMMARY

Exemplary embodiment of the invention provide a two-wire field device in which noise resistance thereof can be enhanced without connecting rectifying elements to both plus and minus sides of a terminal portion thereof.

A field device according to an exemplary embodiment of the invention comprises:
a current output circuit;
a sensor circuit; and
a terminal portion including a rectifying element,
wherein the current output circuit and the sensor circuit are connected a two-wire loop wiring via the terminal portion in a state that the current output circuit and the sensor circuit are connected in series with each other, and wherein the rectifying element is connected to only a sensor circuit side of the terminal portion.

The terminal portion may comprise a grounded capacitor connected between the rectifying element and the sensor circuit.

The sensor circuit may be a grounding type in which a reference point thereof is grounded.

The terminal portion may comprise an inductor connected in series with the rectifying element.

According to the present invention, noise resistance of a two-wire field device can be enhanced without connecting rectifying elements to both plus and minus sides of a terminal portion thereof.

DETAILED DESCRIPTION

Figure 1:
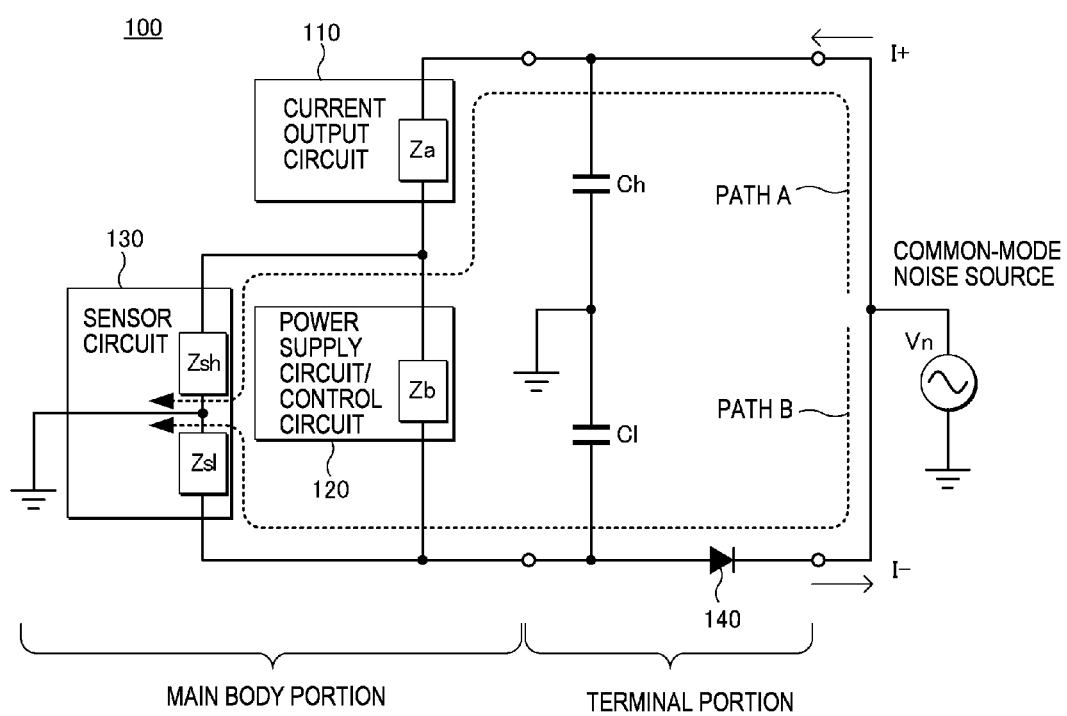
FIG. 1 is a block diagram schematically showing a circuit configuration of a field device according to the present embodiment.

Embodiments of the present invention will be described with reference to the accompanying drawings. FIG. 1 is a block diagram schematically showing a circuit configuration of a field device 100 according to the present embodiment. As shown in this figure, the field device 100, which is connected to a two-wire loop wiring, has, as a main body portion, a current output circuit 110, a power supply circuit/control circuit 120 and a sensor circuit 130, and also has, as a terminal portion, a diode 140, which is a rectifying element, and capacitors Ch and Cl. Meanwhile, because this figure focuses on a common-mode noise mixed in the loop wiring, elements of a direct power supply system connected to the loop wiring are omitted.

The current output circuit 110 controls a current to be flowed into the loop wiring. The power supply circuit/control circuit 120 includes a power supply circuit for supplying electric power, which has been supplied thereto through the loop wiring, to each circuit and a control circuit for calculating a signal from the sensor circuit 130 and determining a current to be flowed into the loop wiring. Impedance Za of the current output circuit 110 is designated as Za and impedance of the power supply circuit/control circuit 120 is designated as Zb.

The capacitors Ch and Cl are capacitors for escaping a high frequency noise, which flows through the loop wiring, to the ground and are respectively connected to plus and minus sides. Specifically, the capacitor Ch is connected between the ground and a plus-side connection point between the terminal portion and the main body portion, and the capacitor Cl is connected between the ground and a minus-side connection point between the terminal portion and the main body portion.

The sensor circuit 130 is intended to measure a physical amount and transmit the physical amount to the power supply circuit/control circuit 120. Herein, the sensor circuit 130 is a grounding type in which a reference point thereof is grounded. Accordingly, impedance Zsh (plus side) and impedance Zsl (minus side) exist with respect to the ground due to stray capacitance and the like.

In the field device 100, a parallel circuit, which is constituted of the power supply circuit/control circuit 120 and the sensor circuit 130, and the current output circuit 110 are connected to the loop wiring via the terminal portion in a state that the parallel circuit and the current output circuit 110 are connected to in series with each other, and the current output circuit 110 is arranged on the plus side.

In the present embodiment, the diode 140 is connected to only the minus side of terminal portion, in which the sensor circuit 130 is arranged. Specifically, the diode 140 is arranged on a wiring path in the terminal portion, which is directly connected with the sensor circuit 130. At this time, the diode 140 is connected to a noise generation side, rather than the capacitor Cl. Namely, a noise rectified in the diode 140 is applied to the capacitor Cl.

If a common-mod noise Vn is mixed in the loop wiring of the field device 100, with a regard to a path A, a noise component, which is divided by the impedance Za of the current output circuit 110 and the plus-side impedance Zsh of the sensor circuit 130, of noise components, which cannot be removed by the capacitor Ch, is applied to the plus side of the sensor circuit 130.

Namely, when the noise applied to the plus side of the sensor circuit 130 is designated as Vnoize, Vnoize is calculated as Vnoize≈Zsh/(Zsh+Za)·Vn.

The current output circuit 110 is typically embodied as a current mirror circuit or a constant current circuit, and in general, Za is an impedance of about 100 kΩ to 10 kΩ. Also, because the plus-side impedance Zsh of the sensor circuit 130 is about 100 kΩ, the noise applied to the sensor circuit 130 becomes about ½ of the common mode noise, so that an influence of the noise on the sensor circuit 130 is relatively small.

With regard to a path B, a noise rectified by the diode 140 and the capacitor Cl is applied to the minus side of the sensor circuit 130. Namely, with regard to both of the path A and the path B, noises are not directly applied to the sensor circuit 130.

Figure 2A:
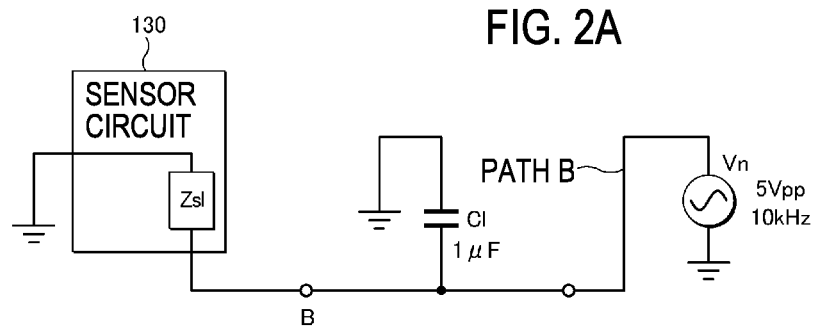
FIGS. 2A and 2B are views explaining noise of a case where a diode is not used.
Figure 2B:
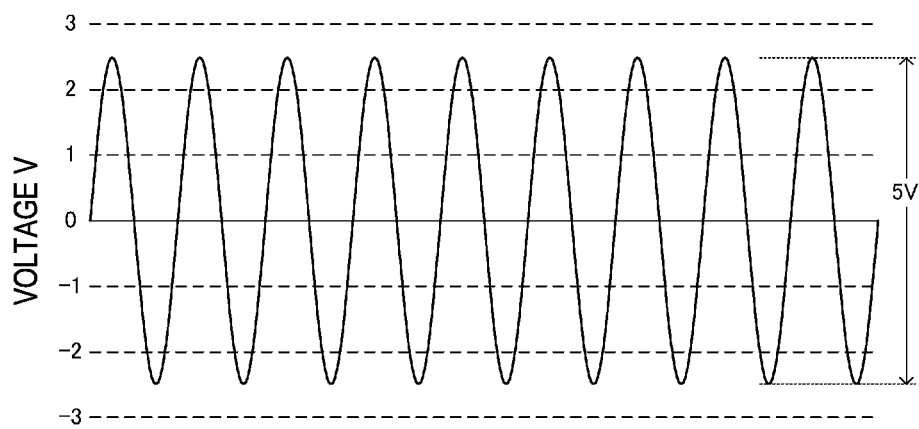

For example, in a case where, as shown in FIG. 2A, the common-mode noise Vn is 5 Vpp and 10 kHz and the capacitor Cl is 1 µF, when the diode 140 is not connected to the path B, a noise having an amplitude of 5V as shown in FIG. 2B is applied to the sensor circuit 130, thereby causing a large noise current to be flowed therethrough.

Figure 3A:
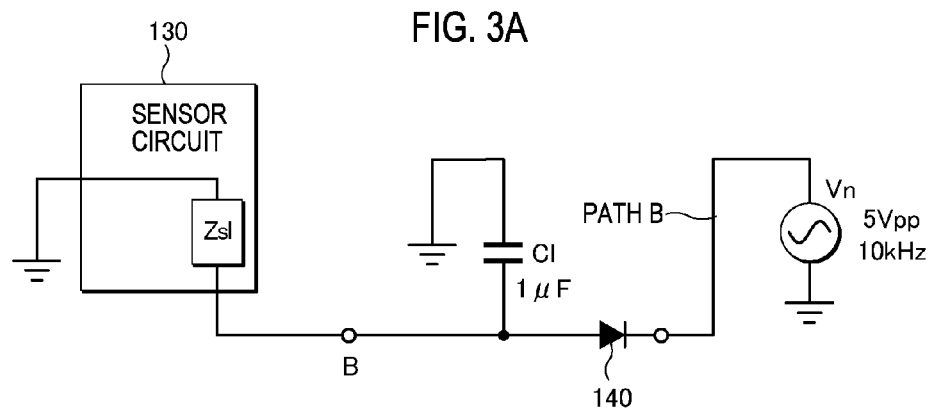
FIGS. 3A and 3B are views explaining noise of a case where a diode is used.
Figure 3B:
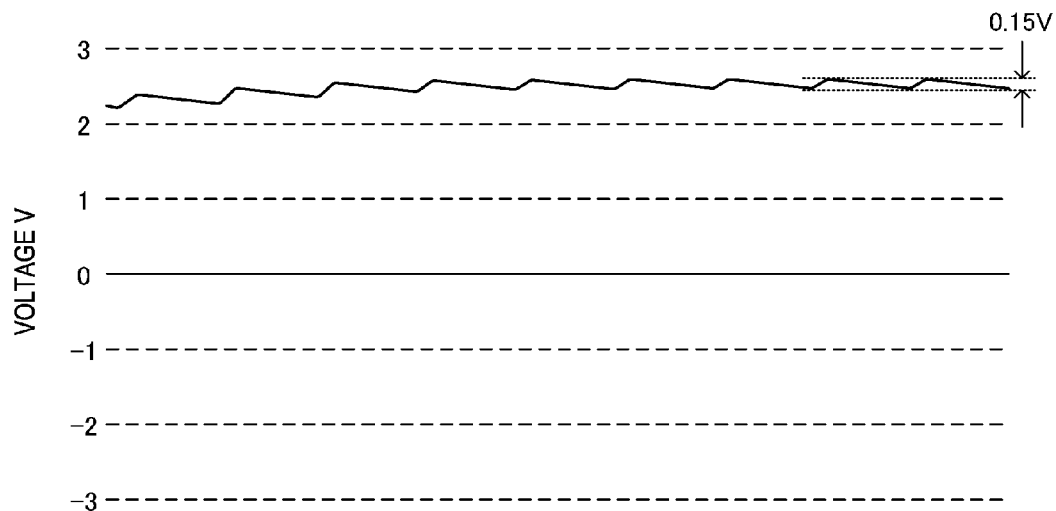

Contrarily, when the diode 140 is connected to the path B as shown in FIG. 3A, an influence of the noise on the sensor circuit 130 becomes small because an alternating noise having a small amplitude as shown in FIG. 3B is applied to the sensor circuit 130.

In the example of the figure, the common mode-noise Vn is 5 Vpp and 10 kHz, the capacitor Cl is 1 µF, and a saturation current of the diode 140 is 100 nA. Because a forward current of the diode 140 is large, a charging time of the capacitor C is very short so that a greater part of a period thereof is a discharging time and thus a current flowing at this time becomes the saturation current. Because the frequency of the common-mode noise is 10 kHz, a time period, during which the saturation current flows, becomes generally 100 μs. A voltage change V in a capacitor when a constant current i flows through the capacitor during a time period of t is obtained as $V=1/C \cdot i \cdot t$, and therefore in this case, the noise amplitude is 0.15 V.

As described above, according to the field device 100 of the present embodiment, a rectifying element is connected to only the sensor circuit 130 side of the terminal portion in an internal circuit thereof having the current output circuit 110 and the sensor circuit 130 connected in series to each other. Accordingly, in one path, a noise divided by the sensor circuit 130 and the current output circuit 110 is applied to the sensor circuit 130 and in the other path, a noise rectified by the rectifying element is applied to the sensor circuit 130, so that noise resistance of the field device 100 can be enhanced without increasing the lowest operation voltage or increasing a withstand voltage of the internal circuit. The rectifying element may be constituted of a bipolar transistor or a CMOS transistor, instead of the diode.

Figure 4:
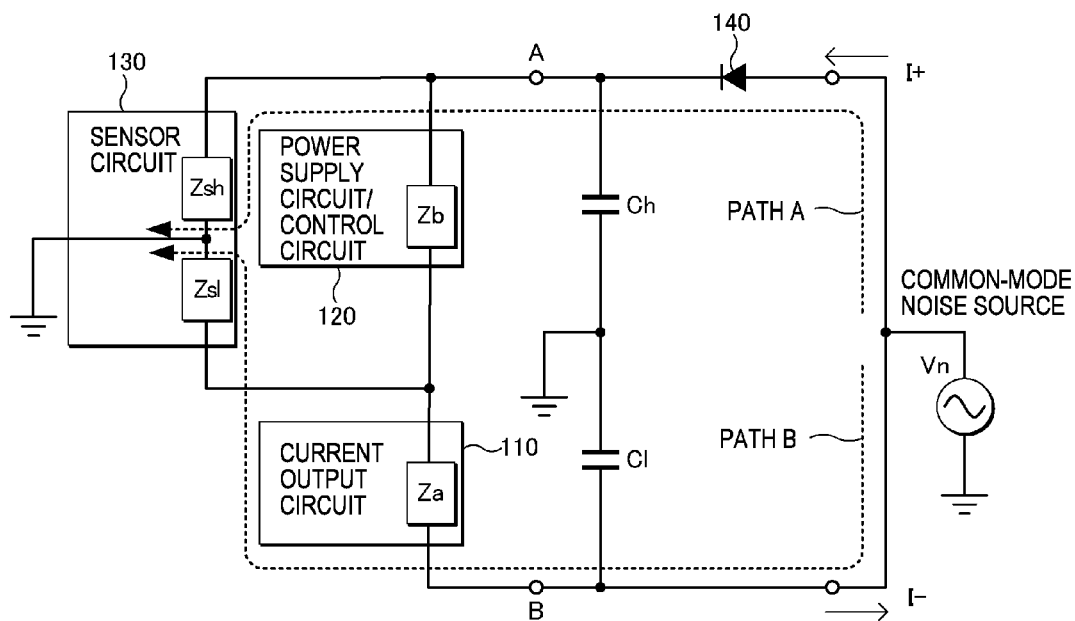
FIG. 4 is a block diagram schematically showing another example of the circuit configuration of the field device according to the embodiment.

Alternatively, although in the example shown in FIG. 1, the current output circuit 110 is arranged on the plus side and thus the diode 140 is connected to the minus side of the terminal portion, as shown in FIG. 4, the diode 140 may be connected to the plus side of the terminal portion when the current output circuit 110 is arranged on the minus side. Specifically, the diode 140 is arranged on a wiring path in the terminal portion, which is directly connected with the sensor circuit 130.

Figure 5:
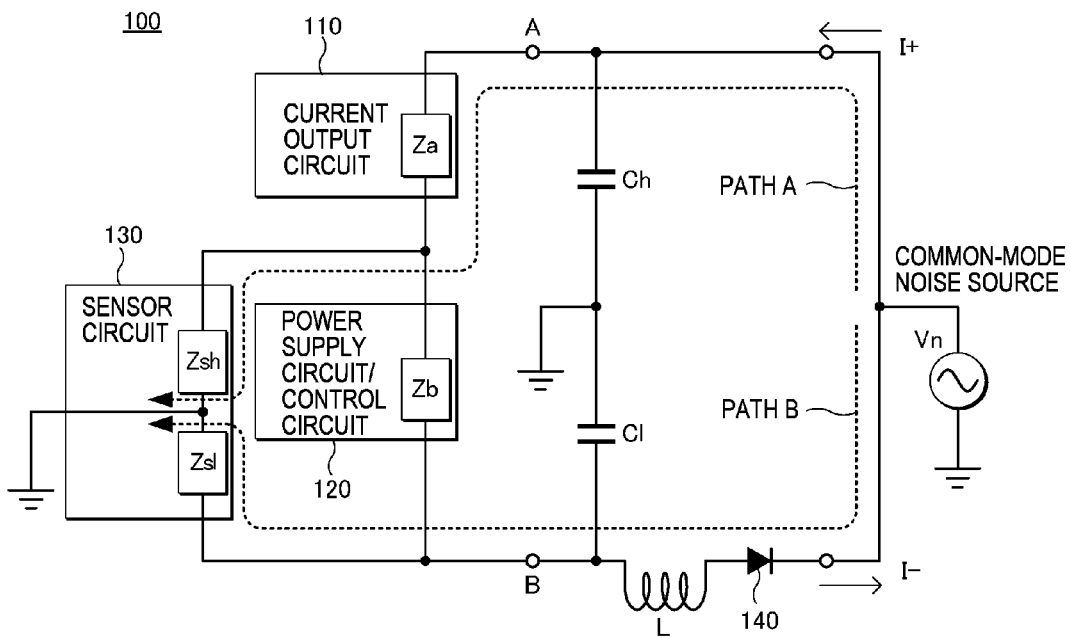
FIG. 5 is a view showing a circuit having an inductor connected in series to a diode.
Figure 6A:
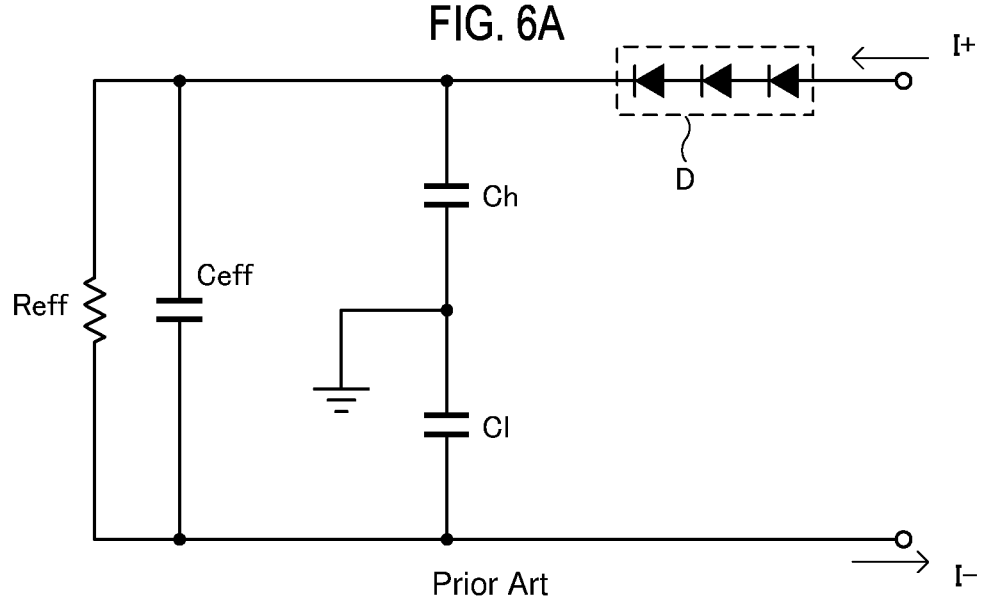
FIGS. 6A and 6B are views showing a circuit having a diode connected thereto to prevent an effective capacitance from being discharged.
Figure 6B:
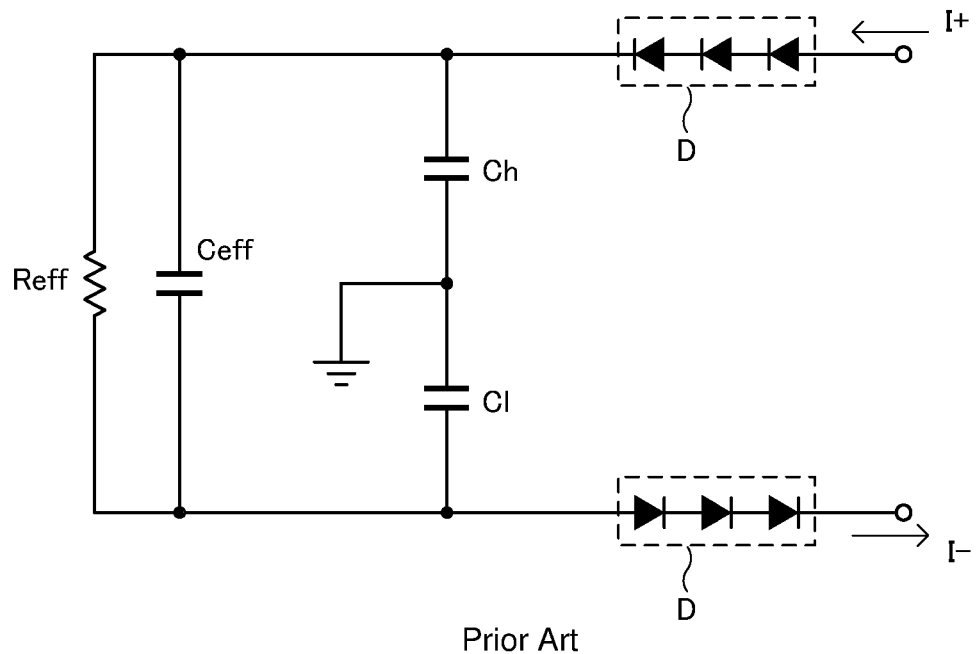
Figure 7A:
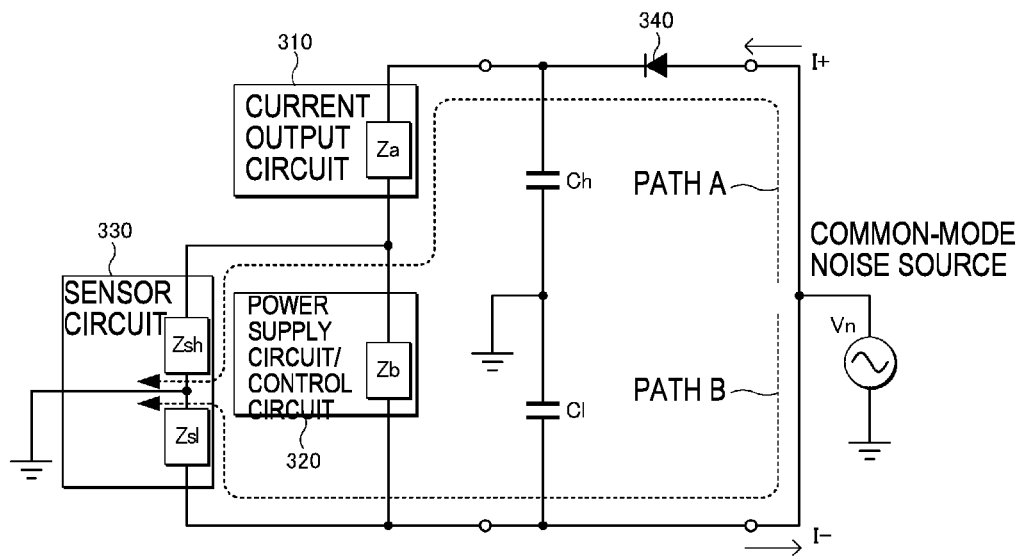
FIGS. 7A and 7B are views schematically showing an impedance circuit including an effective capacitance by means of circuit blocks of an actual field device.
Figure 7B:
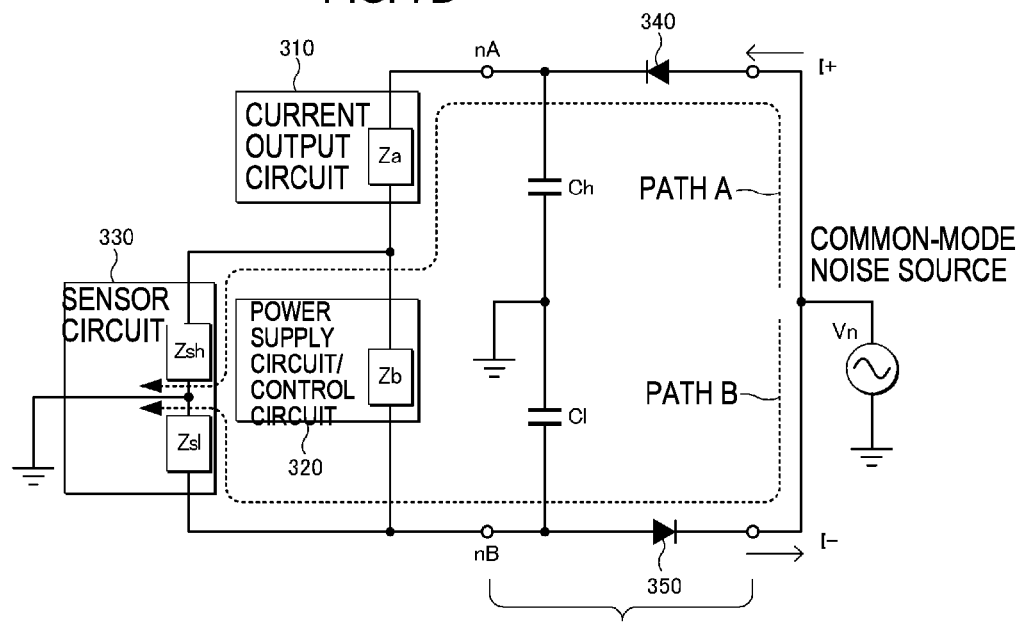

Also, as shown in FIG. 5, an inductor or a ferrite bead may be provided to be connected in series with the diode 140. Thus, a band in which noise can be reduced is widened so the noise resistance can be further enhanced. Specifically, a noise a having high frequency band is limited by the inductor and a noise having a frequency band lower than that is limited by the diode 140. In addition, by combining the diode 140 with the inductor, noise can be reduced without using a large inductor.

What is claimed is:

1. A field device comprising:
    a current output circuit;
    a sensor circuit; and
    a terminal portion including a rectifying element,
    wherein the current output circuit and the sensor circuit are connected to a two-wire loop wiring via the terminal portion in a state that the current output circuit and the sensor circuit are connected in series with each other, and
    wherein the rectifying element is arranged to only a side of the terminal portion connected to the sensor circuit.

2. The field device according to claim 1, wherein the terminal portion comprises a grounded capacitor connected between the rectifying element and the sensor circuit.

3. The field device according to claim 1, further comprising:
    a power supply circuit,
    wherein the sensor circuit and the power supply circuit are connected in parallel,
    wherein the power supply circuit is connected to the two-wire loop wiring via the terminal portion in a state that the current output circuit is connected in series with the power supply circuit and the sensor circuit.

4. The field device according to claim 1, wherein the rectifying element is arranged on a wiring path connecting the power supply side of the terminal portion and the sensor circuit.

5. A field device comprising:
    a current output circuit;
    a sensor circuit; and
    a terminal portion including a rectifying element,
    wherein the current output circuit and the sensor circuit are connected to a two-wire loop wiring via the terminal portion in a state that the current output circuit and the sensor circuit are connected in series with each other,
    wherein the rectifying element is connected to only a sensor circuit side of the terminal portion, and
    wherein the sensor circuit is a grounding type in which a reference point thereof is grounded.

6. A field device comprising:
    a current output circuit;
    a sensor circuit; and
    a terminal portion including a rectifying element,
    wherein the current output circuit and the sensor circuit are connected to a two-wire loop wiring via the terminal portion in a state that the current output circuit and the sensor circuit are connected in series with each other,
    wherein the rectifying element is connected to only a sensor circuit side of the terminal portion, and
    wherein the terminal portion comprises an inductor connected in series with the rectifying element.

* * * * *